(12) United States Patent
Luc-Pat et al.

(10) Patent No.: US 7,665,060 B2
(45) Date of Patent: Feb. 16, 2010

(54) APPROXIMATING WAFER INTENSITY CHANGE TO PROVIDE FAST MASK DEFECT SCORING

(75) Inventors: Gerard T. Luc-Pat, Sunnyvale, CA (US); Raghava V. Kondepudy, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/256,351

(22) Filed: Oct. 22, 2008

(65) Prior Publication Data
US 2009/0046920 A1 Feb. 19, 2009

Related U.S. Application Data

(63) Continuation of application No. 11/295,948, filed on Dec. 6, 2005, now Pat. No. 7,478,360.

(51) Int. Cl.
*G06F 17/50* (2006.01)
*G06K 9/00* (2006.01)

(52) U.S. Cl. .................. 716/21; 382/144; 382/145
(58) Field of Classification Search ............. 716/19–21; 382/144–145
See application file for complete search history.

(56) References Cited

U.S. PATENT DOCUMENTS

| | | | |
|---|---|---|---|
| 4,707,647 A | 11/1987 | Coldren et al. | |
| 5,119,444 A | 6/1992 | Nishihara | |
| 5,438,636 A | 8/1995 | Surka | |
| 6,577,775 B1 | 6/2003 | Li | |
| 6,844,927 B2 | 1/2005 | Stokowski et al. | |
| 6,873,720 B2 | 3/2005 | Cai et al. | |
| 6,884,927 B1 | 4/2005 | Eby | |
| 6,927,003 B2 | 8/2005 | Kim et al. | |
| 2002/0051566 A1 | 5/2002 | Yamashita | |
| 2004/0100629 A1 | 5/2004 | Stokowski et al. | |
| 2004/0157134 A1 | 8/2004 | Kim et al. | |
| 2005/0196688 A1 | 9/2005 | Kim et al. | |
| 2005/0220332 A1 | 10/2005 | Akutagawa et al. | |
| 2007/0058852 A1 | 3/2007 | Pang | |
| 2007/0130557 A1 | 6/2007 | Luk-Pat et al. | |
| 2007/0226676 A1 | 9/2007 | Izuha et al. | |
| 2007/0234269 A1 | 10/2007 | Tanaka et al. | |
| 2007/0292017 A1 | 12/2007 | Cai et al. | |

OTHER PUBLICATIONS

Fiekowsky: "The End of Thresholds: Subwavelength Optical Linewidth Measurement Using The Flux-Area Technique", Presented at Photomask Japan 2000, Poster 4066-67, Apr. 2000.

*Primary Examiner*—Stacy A Whitmore
(74) *Attorney, Agent, or Firm*—Bever, Hoffman & Harms, LLP; Jeanette S. Harms

(57) ABSTRACT

To provide fast mask defect scoring, approximated wafer simulations (e.g. using one convolution) are performed on the defect inspection image and its corresponding reference inspection image. Using the approximated defect wafer image and the approximated reference wafer image generated by these approximated wafer simulations, a defect maximum intensity difference (MID) is computed by subtracting one approximated wafer image from the other approximated wafer image to generate a difference image. After a defect region of the difference image is clearly defined, a simulation at the centroid (i.e. a single point) of the defect region is performed. After the defect MID is computed (represented by an intensity) it can be compared to a prototype MID, which can represent a generic nuisance defect.

31 Claims, 6 Drawing Sheets

304

Draw contour by determining an inspection difference threshold that eliminates most of the noise 341

↓

Approximate wafer simulation of images with Gaussian filter 342

↓

Determine maximum intensity difference between approximated wafer simulations 343

Figure 3B

Approximated reference wafer image 352

Difference Image 353

Approximated defect wafer image 351

APPROXIMATING WAFER INTENSITY CHANGE TO PROVIDE FAST MASK DEFECT SCORING

RELATED APPLICATIONS

This application is a continuation of U.S. patent application Ser. No. 11/295,948, entitled "Approximating Wafer Intensity Change To Provide Fast Mask Defect Scoring" filed Dec. 6, 2005.

BACKGROUND OF THE INVENTION

1. Field of the Invention

The present invention relates to a photolithography mask and in particular to a technique that can provide fast analysis of defects on such a mask.

2. Related Art

FIG. 1 shows a simplified representation of an exemplary digital integrated circuit design flow. At a high level, the process starts with the product idea (step 100) and is realized in an EDA software design process (step 110). When the design is finalized, it can be taped-out (event 140). After tape out, the fabrication process (step 150) and packaging and assembly processes (step 160) occur resulting, ultimately, in finished chips (result 170).

During the fabrication process (step 150), a layout to implement the design is transferred onto a semiconductor substrate. One way to do this is to use the process of optical lithography in which the layout is first transferred onto a physical template, which is in turn used to optically project the layout onto a silicon wafer.

In transferring the layout to a physical template, a mask (usually a quartz plate coated with chrome) is generally created for each layer of the integrated circuit design. This is done by inputting the data representing the layout design for that layer into a device, such as an electron beam machine, which writes the integrated circuit layout pattern into the mask material. In less complicated and dense integrated circuits, each mask comprises the geometric shapes that represent the desired circuit pattern for its corresponding layer. In more complicated and dense circuits in which the size of the circuit features approach the optical limits of the lithography process, the masks may also comprise optical proximity correction features, such as serifs, hammerheads, bias and assist bars, which are sub-resolution, sized features designed to compensate for proximity effects. In other advanced circuit designs, phase shifting masks may be used to circumvent certain basic optical limitations of the process by enhancing the contrast of the optical lithography process.

These masks are then used to optically project the layout onto a silicon wafer coated with photoresist material. For each layer of the design, a light is shone on the mask corresponding to that layer via a visible light source or an ultraviolet light source. This light passes through the clear regions of the mask, whose image exposes the underlying photoresist layer, and is blocked by the opaque regions of the mask, thereby leaving that underlying portion of the photoresist layer unexposed. The exposed photoresist layer is then developed, typically, through chemical removal of the exposed/non-exposed regions of the photoresist layer. The end result is a semiconductor wafer coated with a photoresist layer exhibiting a desired pattern that defines the geometries, features, lines, and shapes of that layer. This process is then repeated for each layer of the design.

As integrated circuit designs become more complicated, it becomes increasingly important that the masks used in photolithography are accurate representations of the original design layout. It is, unfortunately, unrealistic to assume that the electron beam and other machines used to manufacture these masks can do so without error. In the typical manufacturing process, some mask defects do occur outside the controlled process.

A defect on a mask can be defined as anything that is different from the design database and is deemed intolerable by an inspection tool or an inspection engineer. Exemplary defects could include pinhole defects, edge protrusion defects, and geometry bridge defects in the opaque areas of the mask as well as opaque spots and edge intrusion defects in the clear areas of the mask.

FIG. 2 illustrates a simplified system that can inspect a mask for defects. The system includes an inspection tool 200, a stepper image generator 240, and a defect analyzer 290. Inputs to the system include a physical mask 205, a reference description 235, and lithography conditions 265. Reference description 235 can include design layout data (i.e. data that represents a defect free design layout of physical mask 205). In one embodiment, reference description 235 can include a reference image 212 (e.g. an image of a physical mask that was previously inspected and determined to be free from defects).

Inspection tool 200 can include an image acquirer 215, a defect detection processor 225, and a defect area image generator 230. Stepper image generator 240 can include input devices 245 and 255, a mask image simulator 205, and a design image simulator 260. Defect analyzer 290 can include an image comparator 280, a process window analyzer 285, and a performance output device 225.

In this system, inspection tool 200 can inspect physical mask 205 by scanning an image generated by image acquirer 215 for possible defects. This inspection can be carried out by scanning the surface of mask 205 with a high resolution microscope (e.g. optical, scanning electron, focus ion beam, atomic force, or near-field optical microscope) and capturing images of mask 205. For each defect area image that is identified on those captured images, defect detection processor 225 can operate to locate the corresponding area on design layout data 210 and provide this information to input device 255. In one embodiment, the design layout data 210 can be in GDS-II format.

Defect area image generator 230 can generate defect area images of those areas of the mask containing possible defects (as determined by defect detection processor 225). Defect area image generator 230 can provide its defect area image data to input device 245 of stepper image generator 240. Mask image simulator 250 can receive the processed image data from input device 245 as well as lithography conditions input 265 and can generate a defect wafer image 270 as well as simulated process window information.

Note that not all mask defects are important with respect to the desired end result, i.e. an accurate representation of the original design layout on the photoresist material or etched into silicon, because not all mask defects will "print". Loosely speaking, the printability of a defect is how a defect would impact the outcome of a given photolithography and/or etching process. The importance of printability now becomes apparent, because the goal of defect inspection is to correctly identify a defect to avoid a failed wafer processing.

Because printability of a defect is mainly associated with the stepper exposure, it depends on the particular stepper exposure conditions. Therefore to say a defect is "not printable" means that it has little effect on the expected outcome of a particular stepper exposure, even though it may become "printable" under a different set of stepper exposure conditions. Put in a different way, printability can be highly dependent on lithography conditions 265, because a defect may print under one set of conditions, but not another. Lithography conditions 265 can include: wavelength, numerical apertures coherence factor, illumination mode, exposure time, exposure focus/defocus, and the reflection/transmission characteristics of the defect among others.

Input device 255 of stepper image generator 240, in one embodiment, can receive design layout data 210 corresponding to the defect area from defect detection processor 225 and provide design image simulator 260 with design data representing an area to be simulated that corresponds to the defect area being simulated. Design image simulator 260, also using lithography conditions input 265, can generate a reference wafer image 275 and simulated process window information.

Note that in one embodiment reference image 212 may be provided to input device 255. In this embodiment, design image simulator 260 can then use reference image 212 to generate reference wafer image 275 as well as simulated process window information.

Image comparator 280 of defect analyzer 290 can receive defect wafer image 270 and reference wafer image 275. In one embodiment defect analyzer 290 can include a computer-implemented program that is capable of displaying these simulated images as well as displaying the differences between the two images such that an operator can visually detect any differences.

The simulated process window data from stepper image generator 240 can be provided to a process window analyzer 285 of defect analyzer 290. In one embodiment, process window analyzer 285 can be a computer-implemented program capable of displaying the effect that a potential defect area has on the overall process window of the lithography process as compared to the "perfect" design mask. The simulated process window data from stepper image generator 240 can also be provided to a performance output device 225. In one embodiment, performance output device 225 can be a computer-implemented program capable of determining and displaying the effect that one or more defects have on the overall performance of the integrated circuit for which the physical mask 205 will be used to produce.

If there are no defects, or defects are discovered but determined to be within tolerances set by the manufacturer or end-user, then mask 205 can be used to expose a wafer. On the other hand, if defects are discovered that fall outside tolerances, then mask 205 fails inspection. At this point, a decision must be made as to whether the mask may be cleaned and/or repaired to correct the defects or whether the defects are so severe that a new mask must be manufactured.

Although the system described in reference to FIG. 2 provides accurate mask score results, the simulation performed by stepper image generator 240 can take a significant period of time using valuable system resources. In some cases, faster scoring with less emphasis on accuracy can be useful. For example, mask shops with high volume mask throughput may have less stringent accuracy requirements for such masks. Additionally, fabrication facilities could save critical time by avoiding simulation on (and ultimately repair of) very small (i.e. nuisance) defects on physical masks.

Therefore, a need arises for a fast mask defect scoring technique.

SUMMARY OF THE INVENTION

Providing a full simulation of the defect inspection image and the reference inspection image can be slow and resource intensive. In accordance with one aspect of the invention, approximated wafer simulations can be performed on the defect inspection image as well as its corresponding reference inspection image. These approximated wafer simulations can be done using a Gaussian filter and a single convolution.

Using the approximated defect wafer image and the approximated reference wafer image generated by these approximated wafer simulations, a defect maximum intensity difference (MID) can then be computed. Specifically, computing the defect MID can include subtracting one approximated wafer image from the other approximated wafer image to generate a difference image. At this point, a defect region of the difference image can be defined. This defect region can eliminate any noise associated with the difference image. Thus, the defect region effectively narrows the location where the defect MID should be computed.

To further accelerate the defect scoring process, computing the defect MID can further include simulating a centroid (i.e. a single point) of the defect region to generate the defect MID. After the defect MID is computed (represented by an intensity) it can be compared to a prototype MID. This prototype MID can represent a generic nuisance defect or a generic large border defect.

In one embodiment, the detection of defects and the scoring of defects on the mask can be implemented by a computer-implemented program with instructions for performing the above-described processing and computations.

BRIEF DESCRIPTION OF THE FIGURES

FIG. 3B illustrates exemplary steps that can be used to detect defects in a fast scoring technique.

DETAILED DESCRIPTION OF THE FIGURES

Full simulations can provide accurate results that determine whether defects on a mask should be ignored, repaired, or render the mask unusable. However, these simulations are computationally complex and require significant system resources. In some cases, fast mask defect scoring with less accuracy can be useful. In a mask defect scoring technique described below, approximated simulations and the computation of the maximum intensity difference can advantageously speed up simulation as well as measurement.

Figure 3A:
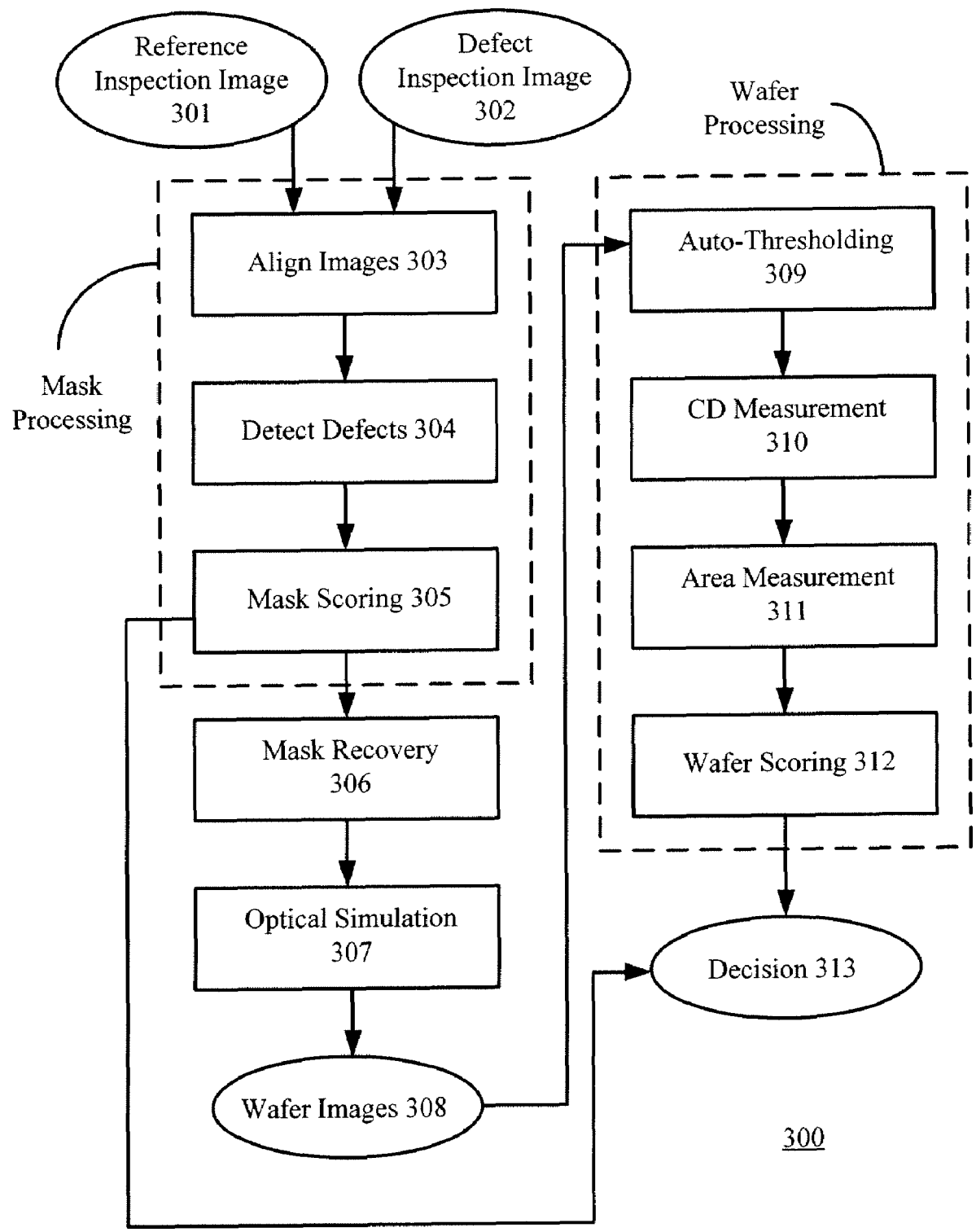
FIG. 3A illustrates an exemplary fast mask defect scoring technique that can be incorporated into a fabrication process.

FIG. 3A illustrates an exemplary fast mask defect scoring technique 300 that can be incorporated into a fabrication process. In step 303, a reference inspection image 301 and a defect inspection image 302 can be aligned. Note that a spatial shift between reference inspection image 301 and a defect inspection image 302 can masquerade as a defect, CD change, etc. (wherein the CD, i.e. the critical dimension, refers to the width of a feature). Therefore, in one embodiment, step 303 can include performing a cross correlation over a limited range of offsets to minimize misalignment.

Step 304 detects any defects after this image alignment. The difference of the inspection images is computed. Defect regions are then established by drawing a contour around each defect. Advantageously, this defect detection can quickly distinguish between nuisance defects, i.e. those defects that will not significantly affect printability, and those defects that require further analysis. FIG. 3B illustrates exemplary steps that can be performed to facilitate this quick defect detection.

In step 341, a contour can be established around the actual defect in the difference image, wherein the area within that contour is defined herein as the defect region. In one embodiment, the contour can be defined by a threshold that eliminates as much of the non-defect region (which can be characterized as "noise") as possible.

In step 342, a full simulation can be approximated using a Gaussian filter. A Gaussian filter is a two-dimensional convolution operator that can perform smoothing. A convolution is a mathematical operation that provides a way of "multiplying together" two arrays of numbers (typically of different sizes) to generate a third array of numbers. In a simple convolution, a kernel can be "slid" over an image so that the kernel moves through all of the positions where the kernel fits entirely within the borders of the image. Each kernel position corresponds to a single output pixel, wherein the value of that pixel is calculated by multiplying together the value of a kernel cell and the corresponding image cell, then adding up the products for that kernel position.

A typical stepper can be characterized as a partially coherent optical system in which points of the light source are not necessarily in-phase. A prevalent way to model a partially coherent optical system is a sum of coherent optical systems where each coherent system has all points of its light source in-phase. In accordance with one aspect of the invention, the wafer image intensity (w) can be computed by the following equation, $$w = \sum_{i=1}^{N} |m * h_i|^2$$

wherein m is the mask, * is the convolution, $h_i$ is the ith coherent kernel, the "| |" operator means amplitude, and N is the number of convolutions/coherent optical systems.

In one embodiment, for each image, i.e. reference inspection image 301 and defect inspection image 302, a single convolution (N=1) can be used to generate an approximated wafer image. (Note that six convolutions (N=6) are typically used for simulations.)

Figure 3C:
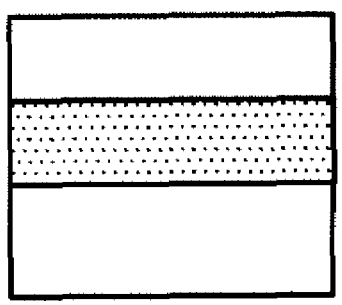
FIG. 3C illustrates how a reference wafer image and a defect wafer image can be used to generate a difference image.
Figure 3C:
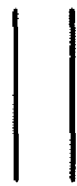
Figure 3C:
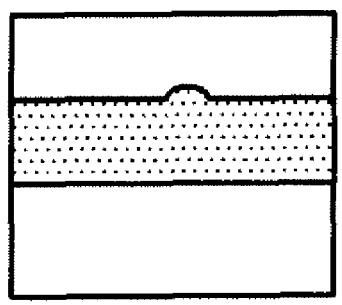
Figure 3C:
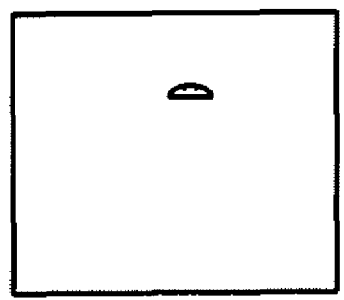
Figure 3C:
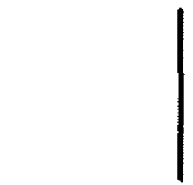

In step 343, a maximum intensity difference between the approximated wafer simulations can be determined. FIG. 3C illustrates a defect approximated wafer image 351 and a reference approximated wafer image 352 that could be generated using step 342 (FIG. 3B). Determining the maximum intensity difference as provided in step 343 can include subtracting one image from another (in this case, subtracting reference approximated wafer image 352 from defect approximated wafer image 351), thereby leaving difference image 353.

Figure 3D:
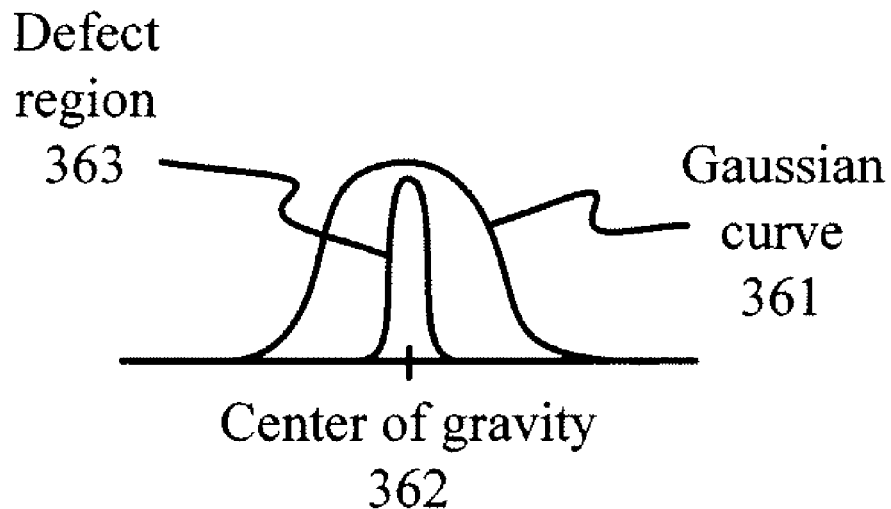
FIG. 3D illustrates that the maximum intensity difference is assumed to be at a known point, i.e. the centroid of the defect region.

To further speed up defect detection, the center of gravity of the defect (i.e. the centroid) can be computed. At this point and referring to FIG. 3D, a Gaussian curve 361, which is centered on the computed center of gravity 362, can be multiplied by the defect region 363 (represented as an intensity profile). Specifically, the product of Gaussian curve 361 and defect region 363 can be integrated over the defect region area. Thus, this integration simulates a single point instead of twelve images (i.e. 2 images at 6 convolutions each), thereby saving considerable time and system resources.

In one embodiment, the standard deviation of Gaussian curve 361 can be defined as lambda/(NA*(1+sigma)*3) or approximately ⅓ the estimated optical resolution of the scanner, wherein lambda (λ) is the wavelength of light used in the scanner, NA is the numerical aperture, and sigma (σ) is the furthest illumination point from the illumination origin. For example, if a circular aperture is used, then sigma is effectively its radius. However, if an annular aperture is used, then sigma could be computed as R2, wherein R2 is the outer radius. Note that irrespective of aperture, sigma is an approximation because the stepper functions are non-linear.

Note that it is possible a defect region can include both light and dark defects. For example, if a mask writer error occurs, then the resulting difference image could include both dark ("positive") as well as light ("negative") areas, which could both be encompassed by the contour defining the defect region. In one embodiment, this composite defect region can be divided, thereby facilitating separate maximum intensity differences (MIDs) to be computed for each type of defect, i.e. one MID for the light defect and another MID for the dark defect. The MID having the largest absolute value can be used to determine defect scoring.

Figure 3E:
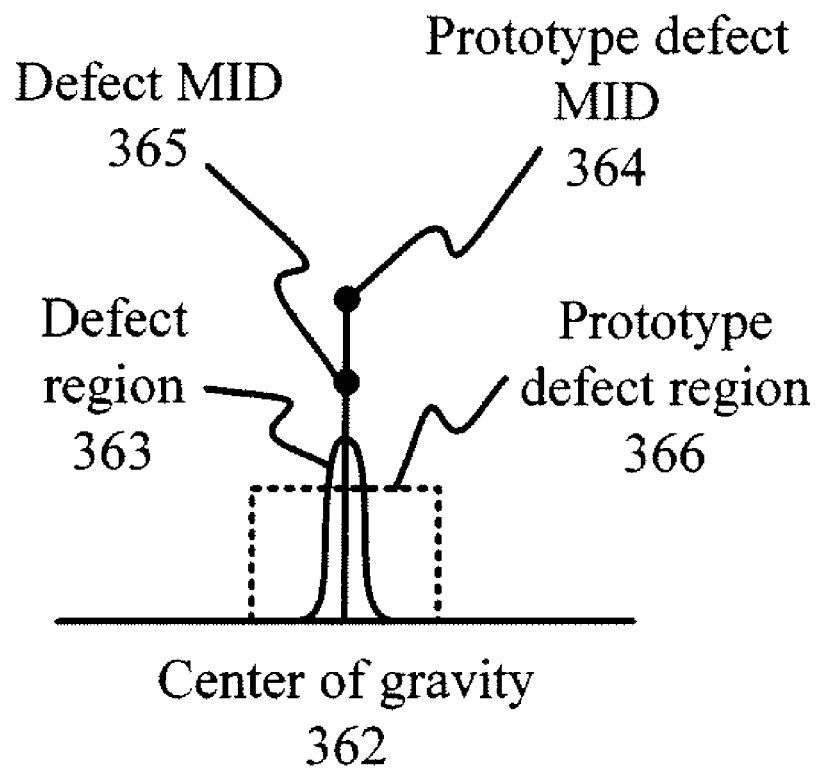
FIG. 3E illustrates how the maximum intensity differences of a defect and a prototype can be compared, thereby determining whether a nuisance defect is identified.

Referring back to FIG. 3A, step 305 outputs a mask score based on the maximum intensity difference computed in defect detection step 304. In accordance with one aspect of the invention shown in FIG. 3E, mask scoring can be performed by comparing an MID 365 (of defect region 363, which is shown for clarity) with a prototype defect MID 364. In one embodiment, prototype defect MID 364 can be one of several prototype defect MIDs that represent nuisance and egregious defects (e.g. defects of a given area and fixed amplitude). In another embodiment, prototype defect MID 364 can represent the MID of a generic nuisance defect 366 (represented as an intensity profile). In this case, if defect MID 365 is less than or not substantially greater than prototype defect MID 364 (e.g. within 10%), then the defect associated with defect region 363 can be characterized as being a nuisance defect. (In a three-dimensional plot, one embodiment of a generic prototype defect 366 could be represented as a square having an area=(target CD)²/10 and an amplitude of 0.5, where the target CD is the smallest intended value of the wafer CD.)

In accordance with one advantage of the invention, full-scale simulations are performed only on those defects characterized as requiring further analysis. In other words, by looking at the results of mask scoring step 305, negligible defects can be quickly identified. Other defects can thus be characterized as requiring further analysis. To perform this analysis, a full simulation (e.g. all convolutions) can be performed on those defects.

Note that mask scoring step 305 is performed using real-valued intensity. However, to perform optical simulation, the necessary input is a complex-valued mask. Therefore, mask recovery step 306 can make this conversion. For an incoherent inspection system, an inspection image intensity (i) and the complex-valued mask (m) have the following relationship:

$$i = |m|^2 * |g|^2$$

wherein g is the inspection system kernel, the "| |" operator means absolute value, and * is a convolution. Therefore, mask recovery step 306 can derive "m" from the "i" of mask scoring step 305.

In one embodiment, mask recovery step 306 can include increasing the defect region to a larger footprint, thereby ensuring that proximity effects from other features can be taken into account. This larger footprint can be up to the footprint of the inspection images 301 and 302. In another embodiment, mask recovery step 306 can also include undoing some effects of the inspection system. For example, the inspection system can discard phase information and blur edges. These effects can be countered by using various techniques.

In step 307, full (i.e. optical) simulation can be performed to generate wafer images 308. During a wafer processing stage, wafer images 308 can be further processed, e.g. using an auto-threshold step 309, a CD measurement step 310, an area measurement step 311, and a wafer scoring step 312. In one embodiment, cutlines to measure feature CDs (or spacing between features) in step 310 can be used in areas having substantially parallel edges. Thus, cutlines would not be used for portions of the features having non-straight edges (e.g. slanted lines). A final decision 313 regarding the repair of defects on the mask can be made using the results from mask scoring step 305 and wafer scoring step 312.

Figure 1:
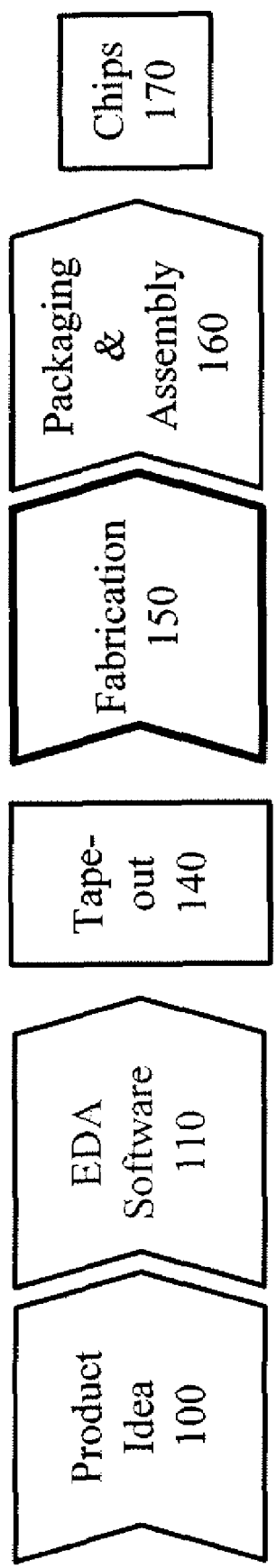
FIG. 1 illustrates a simplified representation of an exemplary digital integrated circuit design flow.
Figure 2:
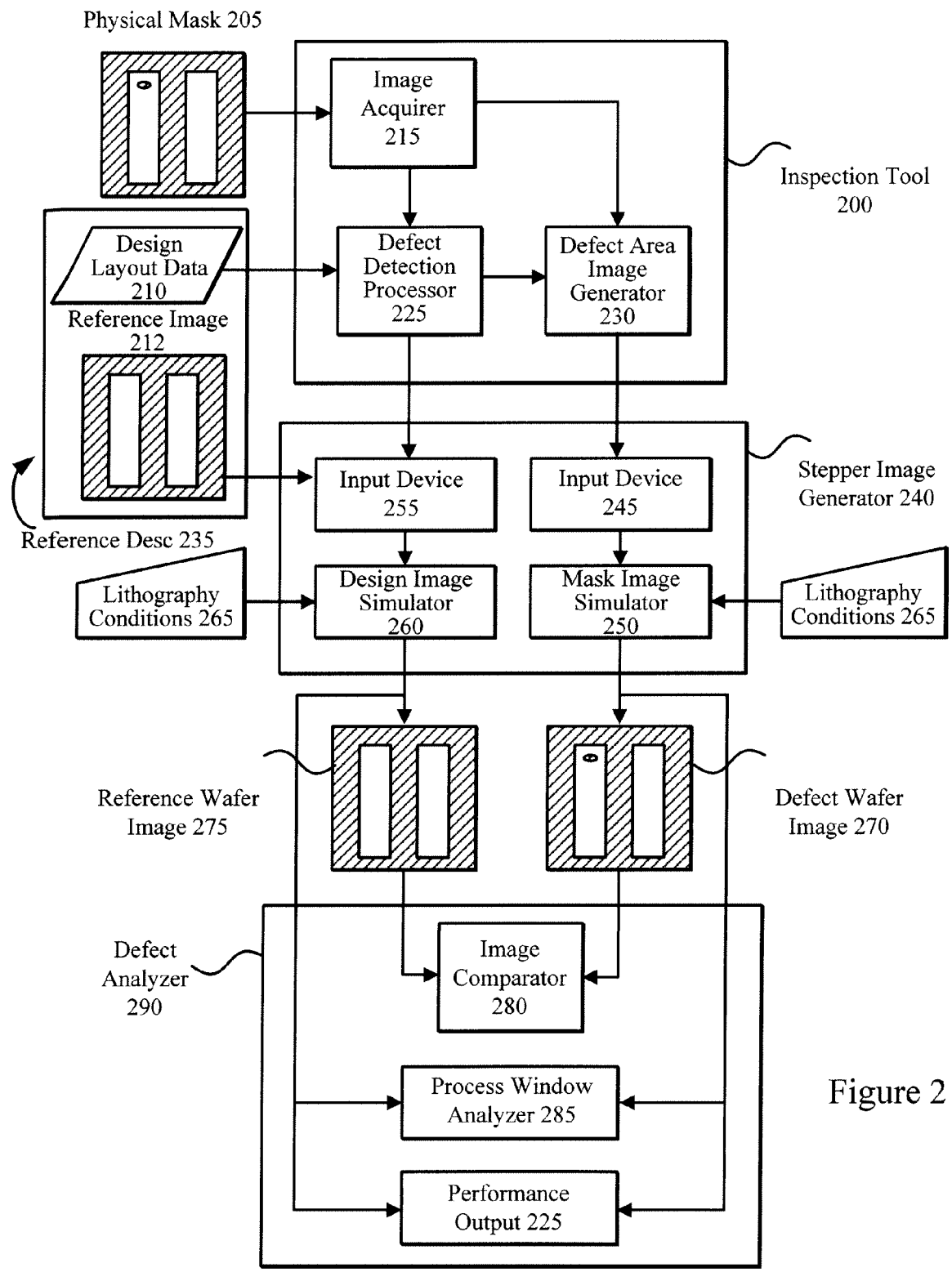
FIG. 2 illustrates a simplified system that can inspect a mask for defects.

Notably, the above-described fast mask defect scoring technique changes a non-linear technique into a linear technique. Specifically, comparing simulations (e.g. 6 convolutions) of the reference and defect inspection images is a non-linear technique. For example, referring back to FIG. 2, image comparator 280 can be characterized as performing the following computation in which "w" is the simulated wafer:

$$w_{difference} = w_{defect} - w_{reference}$$

This computation can be rewritten as:

$$w_{difference} = q(m_{defect}) - q(m_{reference})$$

wherein $q = |m * h_i|^2$

However, notably $$w_{difference} \neq q(m_{defect} - m_{reference})$$

In contrast, referring to FIG. 3B, step 342 can be characterized as performing the following computation in which "w'" is the approximated wafer and "h" is the approximate incoherent kernel.

$$w'_{difference} = w'_{defect} - w'_{reference}$$

This computation can be rewritten as:

$$w'_{difference} = q'(m_{defect}) - q'(m_{reference})$$

wherein $q' = |m|^2 * |h_i|^2$

Notably, in this case, $$w'_{difference} = q'(m_{defect} - m_{reference})$$

Therefore, using the estimated simulations is a linear technique with respect to the inspection image $|m|^2$. Advantageously, a linear technique is significantly faster than a non-linear technique.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, note that full simulations of inspection images generate wafer images that have varying degrees of trustworthiness. Specifically, the portions of the wafer image corresponding to the periphery of the inspection image are not as trustworthy as the portions of the wafer image corresponding to the central part of the inspection image. That is, the wafer image periphery can be affected by mask features adjacent to, but outside the border of the inspection image. However, these mask features just outside the inspection image borders are unknown. In one embodiment, the periphery region can be defined as within 0.49*wavelength/ (NA*sigma) of the border. Therefore, the above-described fast mask defect scoring technique can be used in areas of the mask where accuracy (by performing full simulation) is not possible. In one embodiment, for a given defect, two MID values can be computed—one MID at the defect centroid and another MID at the nearest periphery point. The MID of a defect region in the periphery of a wafer image can be computed as follows: (i) find the nearest point of the periphery to the defect region centroid and (ii) at that nearest periphery point, compute the intensity of the difference image that is caused by the defect region. The defect is then characterized as significant if its MID at the nearest periphery point is larger than the MID of some prototype defect that represents a large border defect. Note that the larger border prototype defect can be different from the nuisance prototype defect.

Note that the above-described nuisance defect characterization can be combined with more traditional defect characterization techniques. For example, in one embodiment, a defect can be characterized as a nuisance defect if (1) the defect MID is less than the prototype defect MID and (2) the area of the defect (e.g. using the defect region) is less than a predetermined area. Thus, a defect that appears very diffuse in an approximated simulation may have a low MID, but still take up a large area. Therefore, the combined characterization using MID and area could ensure that such a defect would not be characterized as a nuisance defect, thereby triggering further analysis of that defect using full simulation.

In one embodiment, the detection of defects (step 304, FIG. 3) and the scoring of defects on the mask (step 305) can be implemented by a computer-implemented program with instructions for performing the above-described processing and computations.

Accordingly, it is intended that the scope of the invention be defined by the following Claims and their equivalents.

The invention claimed is:

1. A method of generating a fast mask defect score, the method comprising:
   using a mask inspection system,
   performing a first approximated wafer simulation of a defect inspection image to generate an approximated defect wafer image;
   performing a second approximated wafer simulation of a corresponding reference inspection image to generate an approximated reference wafer image; and
   computing a defect maximum intensity difference (MID) by subtracting the approximated defect wafer image from the approximated reference wafer image to generate a difference image, computing a centroid of a defect region of the difference image, multiplying the defect region and a Gaussian curve centered on the centroid to generate a product, and integrating the product over the defect region.

2. The method of claim 1, wherein performing the first and second approximate wafer simulations includes using a Gaussian filter.

3. The method of claim 1, wherein a standard deviation of the Gaussian curve is defined as lambda/(NA*(1+sigma)*3), where lambda is a wavelength of light used in a scanner, NA is a numerical aperture, and sigma is a furthest illumination point from an illumination origin.

4. The method of claim 1, wherein a standard deviation of the Gaussian curve is defined as approximately ⅓ an estimated optical resolution of a scanner.

5. The method of claim 1, wherein computing the MID is performed for only light defects.

6. The method of claim 1, wherein computing the MID is performed for only dark defects.

7. The method of claim 1, wherein computing the MID includes:
    computing a first MID only for light defects at a first time;
    computing a second MID only for dark defects at a second time; and
    using a largest absolute value from computing the first and second MIDs to determine defect scoring.

8. The method of claim 1, further including comparing the defect MID to a prototype MID.

9. The method of claim 8, wherein the prototype MID represents a generic nuisance defect.

10. The method of claim 8, wherein the prototype MID represents a generic large border defect.

11. A computer-readable medium embodying instructions that when executed by a computer would generate a fast mask defect score, the instructions comprising:
    instructions for performing a first approximated wafer simulation of a defect inspection image to generate an approximated defect wafer image;
    instructions for performing a second approximated wafer simulation of a reference inspection image to generate an approximated reference wafer image; and
    instructions for computing a defect maximum intensity difference (MID) by subtracting the approximated defect wafer image from the approximated reference wafer image to generate a difference image, computing a centroid of a defect region of the difference image, multiplying the defect region and a Gaussian curve centered on the centroid to generate a product, and integrating the product over the defect region.

12. The computer-readable medium of claim 11, wherein each of the instructions for performing the first and second approximate wafer simulations includes instructions for using a Gaussian filter.

13. The computer-readable medium of claim 11, further including instructions for defining a standard deviation of the Gaussian curve as lambda/(NA*(1+sigma)*3), where lambda is a wavelength of light used in a scanner, NA is a numerical aperture, and sigma is a furthest illumination point from an illumination origin.

14. The computer-readable medium of claim 11, further including instructions for defining a standard deviation of the Gaussian curve as approximately ⅓ an estimated optical resolution of a scanner.

15. The computer-readable medium of claim 11, wherein the instructions for computing the MID are performed for only light defects.

16. The computer-readable medium of claim 11, wherein the instructions for computing the MID are performed for only dark defects.

17. The computer-readable medium of claim 11, wherein the instructions for computing the MID include:
    instructions for computing a first MID only for light defects at a first time;
    instructions for computing a second MID only for dark defects at a second time; and
    instructions for using a largest absolute value from computing the first and second MIDs to determine defect scoring.

18. The computer-readable medium of claim 11, further including instructions for comparing the defect MID to a prototype MID.

19. The computer-readable medium of claim 18, wherein the prototype MID represents a generic nuisance defect.

20. The computer-readable medium of claim 19, wherein the prototype MID represents a generic large border defect.

21. A method of generating a fast mask defect score, the method comprising:
    using a mask inspection system,
    performing a first approximated wafer simulation of a defect inspection image to generate an approximated defect wafer image;
    performing a second approximated wafer simulation of a corresponding reference inspection image to generate an approximated reference wafer image, wherein performing the first and second approximate wafer simulations includes performing a single convolution; and
    computing a defect maximum intensity difference (MID) using the approximated defect and reference wafer images.

22. The method of claim 21, wherein performing the first and second approximate wafer simulations includes using a Gaussian filter.

23. The method of claim 21, wherein performing the first and second approximate wafer simulations includes using a filter.

24. The method of claim 21, wherein computing the defect MID includes subtracting one approximated wafer image from the other approximated wafer image to generate a difference image.

25. The method of claim 24, wherein computing the defect MID further includes defining a defect region of the difference image.

26. The method of claim 25, wherein computing the defect MID further includes simulating a single point of the difference image to generate the defect MID.

27. The method of claim 26, wherein computing the defect MID further includes simulating a centroid of the defect region to generate the defect MID.

28. The method of claim 26, wherein computing the defect MID further includes simulating a nearest point of a periphery region to the defect region to generate the defect MID.

29. The method of claim 21, further including comparing the defect MID to a prototype MID.

30. The method of claim 29, wherein the prototype MID represents a generic nuisance defect.

31. The method of claim 29, wherein the prototype MID represents a generic large border defect.

* * * * *